US012701739B2

(12) United States Patent
Hitchcock et al.

(10) Patent No.: US 12,701,739 B2
(45) Date of Patent: Aug. 4, 2026

(54) RADIATION HARDENED SEMICONDUCTOR POWER DEVICE

(71) Applicant: GE Aviation Systems LLC, Grand Rapids, MI (US)

(72) Inventors: Collin William Hitchcock, Clifton Park, NY (US); Biju Jacob, Niskayuna, NY (US)

(73) Assignee: GE Aviation Systems LLC, Grand Rapids, MI (US)

( * ) Notice: Subject to any disclaimer, the term of this patent is extended or adjusted under 35 U.S.C. 154(b) by 393 days.

(21) Appl. No.: 18/470,120

(22) Filed: Sep. 19, 2023

(65) Prior Publication Data

US 2025/0098208 A1     Mar. 20, 2025

(51) Int. Cl.
| | |
|---|---|
| *H10D 30/64* | (2025.01) |
| *H10D 30/01* | (2025.01) |
| *H10D 62/10* | (2025.01) |

(52) U.S. Cl.
CPC ........... *H10D 30/64* (2025.01); *H10D 30/028* (2025.01); *H10D 62/105* (2025.01)

(58) Field of Classification Search
CPC .... H10D 30/64; H10D 30/028; H10D 62/105; H10D 30/66; H10D 30/0291; H10D 12/031; H10D 62/393
See application file for complete search history.

(56) References Cited

U.S. PATENT DOCUMENTS

| | | | |
|---|---|---|---|
| 6,313,482 B1 | 11/2001 | Baliga | |
| 7,427,326 B2 | 9/2008 | Sumakeris | |
| 8,541,787 B2 | 9/2013 | Zhang | |
| 8,829,533 B2 | 9/2014 | Domeij | |
| 10,115,834 B2 | 10/2018 | Vobecky | |
| 10,615,274 B2 | 4/2020 | Lichtenwalner | |
| 11,084,222 B2 | 8/2021 | Yackabonis | |

(Continued)

FOREIGN PATENT DOCUMENTS

| | | |
|---|---|---|
| CN | 113488560 | 10/2021 |
| FR | 3127024 | 3/2023 |

(Continued)

OTHER PUBLICATIONS

Xu Hongyi et al: "Methodology for Enhanced Surge Robustness of 1.2-kV Sic MOSFET Body Diode", IEEE Journal of Emerging and Selected Topics in Power Electronics, IEEE, Piscataway, NJ, USA vol. 10, No. 5, Aug. 20, 2021 (Aug. 20, 2021), pp. 5039-5047, XP011921872, ISSN: 2168-6777, DOI: 10.1109/JESTPE.2021. 3106742.

(Continued)

*Primary Examiner* — Wasiul Haider
(74) *Attorney, Agent, or Firm* — Fitch, Even, Tabin & Flannery LLP

(57) ABSTRACT

A radiation hardened semiconductor device including a heavily doped substrate of a semiconductor device, a drift layer having a substantially uniform doping concentration and a thickness is provided. The doping concentration and the thickness of the drift layer are such that when the semiconductor device is operating at a maximum voltage rating, an electrical field profile in the drift layer extends less than 80% of the thickness of the drift layer, providing the radiation hardened nature of the device.

17 Claims, 10 Drawing Sheets

(56) References Cited

U.S. PATENT DOCUMENTS

| | | | | |
|---|---|---|---|---|
| 2009/0117724 A1* | 5/2009 | Iwamuro | ............ | H10D 30/0291 |
| | | | | 257/E21.24 |
| 2016/0336392 A1 | 11/2016 | Tominaga | | |
| 2019/0198659 A1 | 6/2019 | Lichtenwalner | | |
| 2020/0365721 A1* | 11/2020 | Lichtenwalner | ....... | H10D 30/66 |

FOREIGN PATENT DOCUMENTS

| FR | 3127025 | 3/2023 |
|---|---|---|
| FR | 3127269 | 3/2023 |
| FR | 3129375 | 5/2023 |
| FR | 3129428 | 5/2023 |
| FR | 3129432 | 5/2023 |
| FR | 3129436 | 5/2023 |
| FR | 3129690 | 6/2023 |
| FR | 3129970 | 6/2023 |
| FR | 3129972 | 6/2023 |
| FR | 3130313 | 6/2023 |
| FR | 3130323 | 6/2023 |
| FR | 3130747 | 6/2023 |
| FR | 3130874 | 6/2023 |
| FR | 3130875 | 6/2023 |
| FR | 3130877 | 6/2023 |
| FR | 3130879 | 6/2023 |
| FR | 3130894 | 6/2023 |
| FR | 3130895 | 6/2023 |
| FR | 3130896 | 6/2023 |
| FR | 3130897 | 6/2023 |
| FR | 3132279 | 8/2023 |
| FR | 3132729 | 8/2023 |
| FR | 3132743 | 8/2023 |
| FR | 3133367 | 9/2023 |
| FR | 3133368 | 9/2023 |
| JP | 2001511315 | 8/2001 |
| JP | 2011086883 | 4/2011 |
| JP | 2023535019 | 8/2023 |
| KR | 20190100990 A | 8/2019 |
| KR | 102056356 | 12/2019 |
| KR | 20220079636 A | 6/2022 |
| KR | 20230041785 A | 3/2023 |
| KR | 20230104739 | 7/2023 |
| WO | 2015115202 | 8/2015 |
| WO | 2022020147 | 1/2022 |

OTHER PUBLICATIONS

Li Sheng et al: "Electrical parameters 1-15 shifts of 1.2kV 4H-SiC MOSFET under cosmic radiations", 2017 IEEE 24th International Symposium on the Physical and Failure Analysis of Integrated Circuits (IPFA), IEEE, Jul. 4, 2017 (Jul. 4, 2017), pp. 1-4, XP033162959, DOI: 10.1109/IPFA.2017.8060191.

McPherson, Hitchcock, et. al., Materials Science Forum, vol. 1004, pp. 889-896, doi: 10.4028/www.scientific.net/MSF.1004.889 (buffer structure ultimately covered by CREE patent).

Xingguang Zhu et. al., Radiation Hardness Study on SiC Power MOSFETs: https://ntrs.nasa.gov/api/citations/20190001574/downloads/20190001574.pdf, International Conference on Silicon Carbide and Related Materials (ICSCRM 2017), Sep. 17-22, 2017; 1 pg.

\* cited by examiner

28

| Forming A Drift Layer On A Substrate Through Epitaxy | ~710 |

| Forming Source, Gate, And Drain Structures Over The Drift Layer | ~720 |

| Selecting A Drift Layer Doping Concentration And A Drift Layer Thickness (n) | ~730 |

| Forming The Drift Layer Having The Drift Layer Doping Concentration And The Drift Layer Thickness At Least 20% Greater Than n | ~740 |

RADIATION HARDENED SEMICONDUCTOR POWER DEVICE

GOVERNMENT INTERESTS

This invention was made with government support contract no. 80NSSC21K0766 awarded by the National Aeronautics and Space Administration (NASA). The government has certain rights in the invention.

TECHNICAL FIELD

These teachings relate generally to semiconductor power devices and more specifically to radiation hardened semiconductor power devices.

BACKGROUND

Semiconductor devices may be used in various applications. These semiconductor devices, such as silicon carbide (SiC) power MOSFETs (metal oxide semiconductor field effect transistors), provide commercial advantages, such as high-power applications. It is believed that, due to SiC based power electronics' large bandgaps, these devices would be more tolerant to radiation effects in these applications. However, SiC semiconductor power devices can be susceptible to at least single event effects, and in particular to single event burnout and subject to failure at high blocking voltages due to radiation intolerance.

BRIEF DESCRIPTION OF DRAWINGS

Various needs are at least partially met through provision of the radiation hardened semiconductor power device described in the following detailed description, particularly when studied in conjunction with the drawings. A full and enabling disclosure of the aspects of the present description, including the best mode thereof, directed to one of ordinary skill in the art, is set forth in the specification, which refers to the appended figures, in which.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present teachings. Also, common but well-understood elements that are useful or necessary in a commercially feasible embodiment are often not depicted in order to facilitate a less obstructed view of these various embodiments of the present teachings. Certain actions and/or steps may be described or depicted in a particular order of occurrence while those skilled in the art will understand that such specificity with respect to sequence is not actually required.

DETAILED DESCRIPTION

The terms and expressions used herein have the ordinary technical meaning as is accorded to such terms and expressions by persons skilled in the technical field as set forth above except where different specific meanings have otherwise been set forth herein. The word "or" when used herein shall be interpreted as having a disjunctive construction rather than a conjunctive construction unless otherwise specifically indicated. The terms "coupled," "fixed," "attached to," and the like refer to both direct coupling, fixing, or attaching, as well as indirect coupling, fixing, or attaching through one or more intermediate components or features, unless otherwise specified herein.

The singular forms "a", "an", and "the" include plural references unless the context clearly dictates otherwise.

Approximating language, as used herein throughout the specification and claims, is applied to modify any quantitative representation that could permissibly vary without resulting in a change in the basic function to which it is related. Accordingly, a value modified by a term or terms such as "about", "approximately", and "substantially", are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 10 percent margin.

Figure 1A:
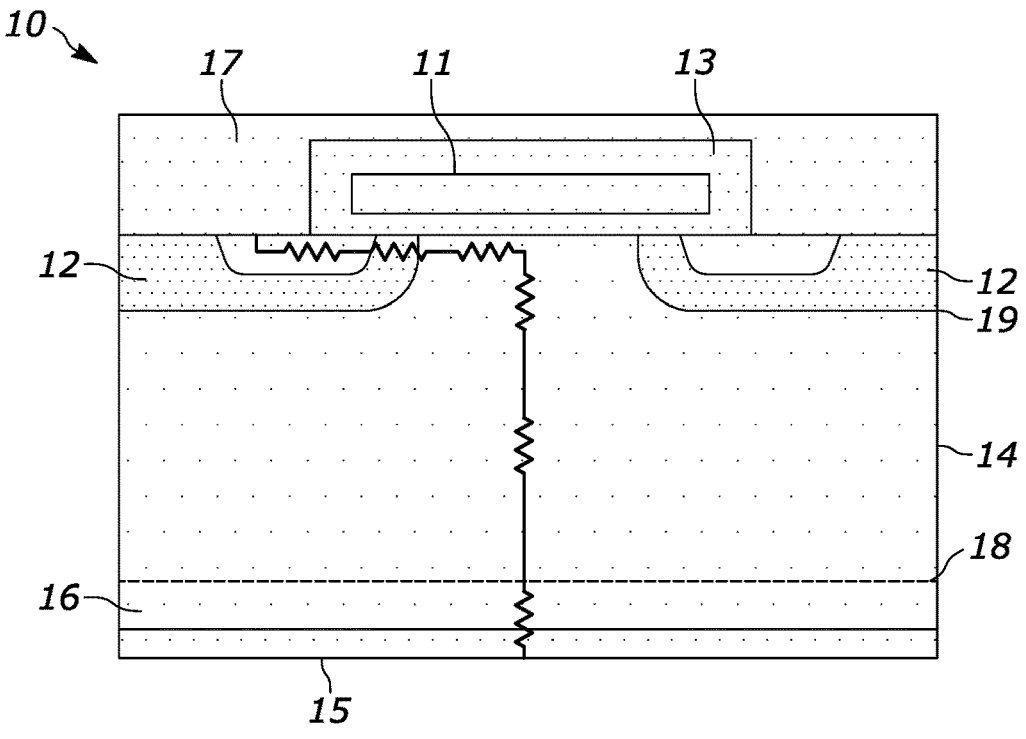
FIG. 1A illustrates a conventional semiconductor device as known in the art.

Conventional semiconductor devices 10, as shown in FIG. 1A, typically includes a p-type layer 12, an epitaxial layer 14 functioning as a drift or depletion layer, and a substrate 16. The conventional semiconductor device 10 also includes a junction 18 between the epitaxial layer 14 and the substrate 16, and a junction 19 between the epitaxial layer 14 and the p-type layer 12. The conventional semiconductor device 10 may additionally include a source region 17 and a drain region 15. Further, the conventional semiconductor device 10 may include a gate dielectric layer 13 and a gate electrode 11. The conventional semiconductor device 10 may provide a high blocking voltage and thus may be useful for high-power applications as discussed above. However, the conventional semiconductor device 10 may be subject to failure at high blocking voltages due to radiation intolerance and failure to survive a radiation event. An exemplary radiation event, as known in the art, may occur when a semiconductor device is struck by heavy ions, beta, gamma, or neutrons while operating near its maximum voltage rating. The high energy associated with these ions is difficult to shield the semiconductor device from and leaves numerous electron-hole pairs. These radiation events may be characterized as single event effects and/or single event burnout. Ultimately, these radiation events may lead to device failure in some instances. The current art provides solutions to this, however, in doing so, creates additional challenges and complications as discussed below.

Figure 1B:
FIG. 1B comprises a graph of the conventional semiconductor device operating at its breakdown voltage as known in the art.

FIG. 1B, illustrates a one-dimensional cross section graph 22 of a conventional semiconductor device 10 operating at its breakdown voltage, with linear distance on the x-axis and magnitude of electric field on the y-axis, as known in the art. Graph 22 illustrates the depletion of the epitaxial layer of a conventional semiconductor device 10 with the strength the electrical field profile across the epitaxial layer 14 towards the junction 18 with the substrate 16. FIG. 1B illustrates a semiconductor device having a 9 um epitaxial layer operating at the maximum voltage rating of 1600V. FIG. 1B illustrates the conventional semiconductor device 10 just before breakdown. When the semiconductor device breaks down at the junction 19, the resulting electric field profile is a trapezoidal electric field across the epitaxial layer and the substrate of the conventional semiconductor device 10, as shown in the graph 22. The trapezoidal electric field profile indicates the epitaxial layer is completely depleted. When sustained breakdown occurs, or operation of the conventional semiconductor device 10 occurs at higher operating voltages, the conventional semiconductor device 10 may be damaged over time.

Figure 2A:
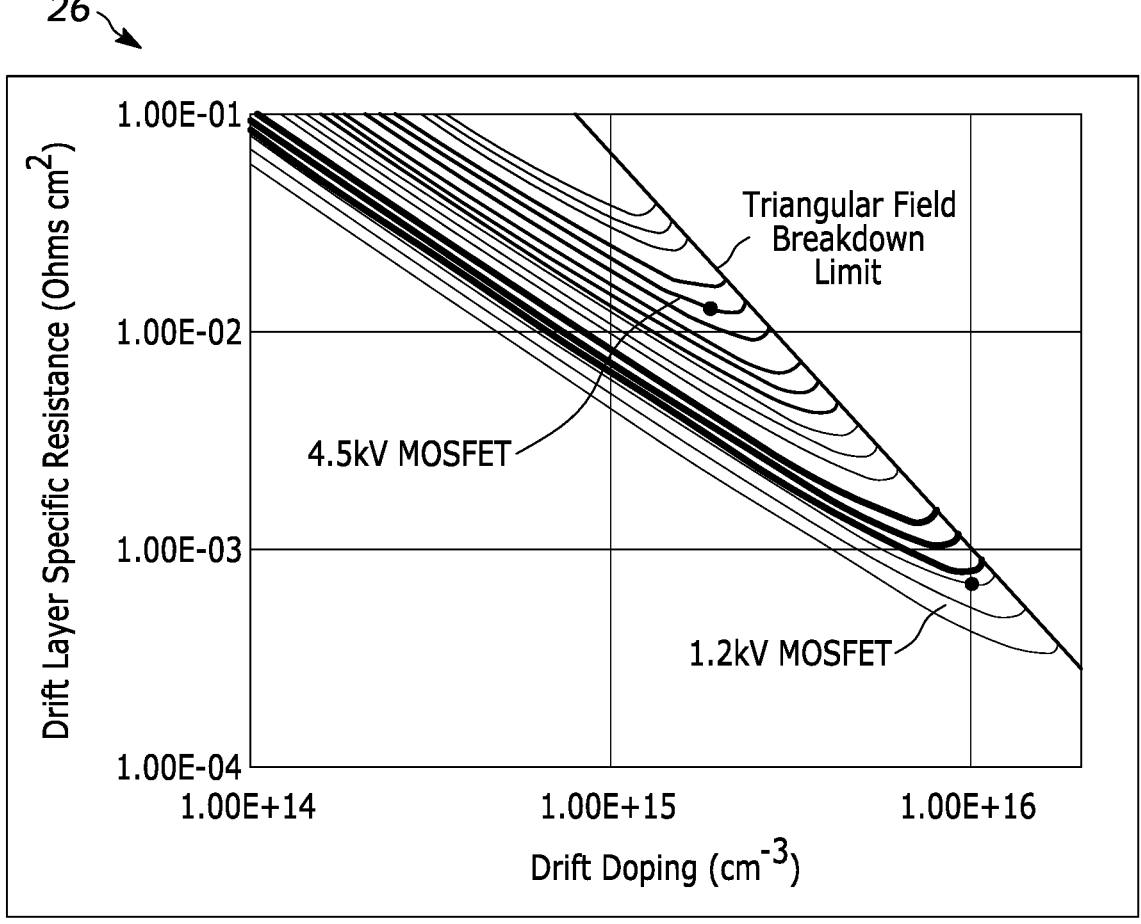
FIG. 2A comprises a graph of drift layer resistance as a function of drift doping of known semiconductor devices.
Figure 2B:
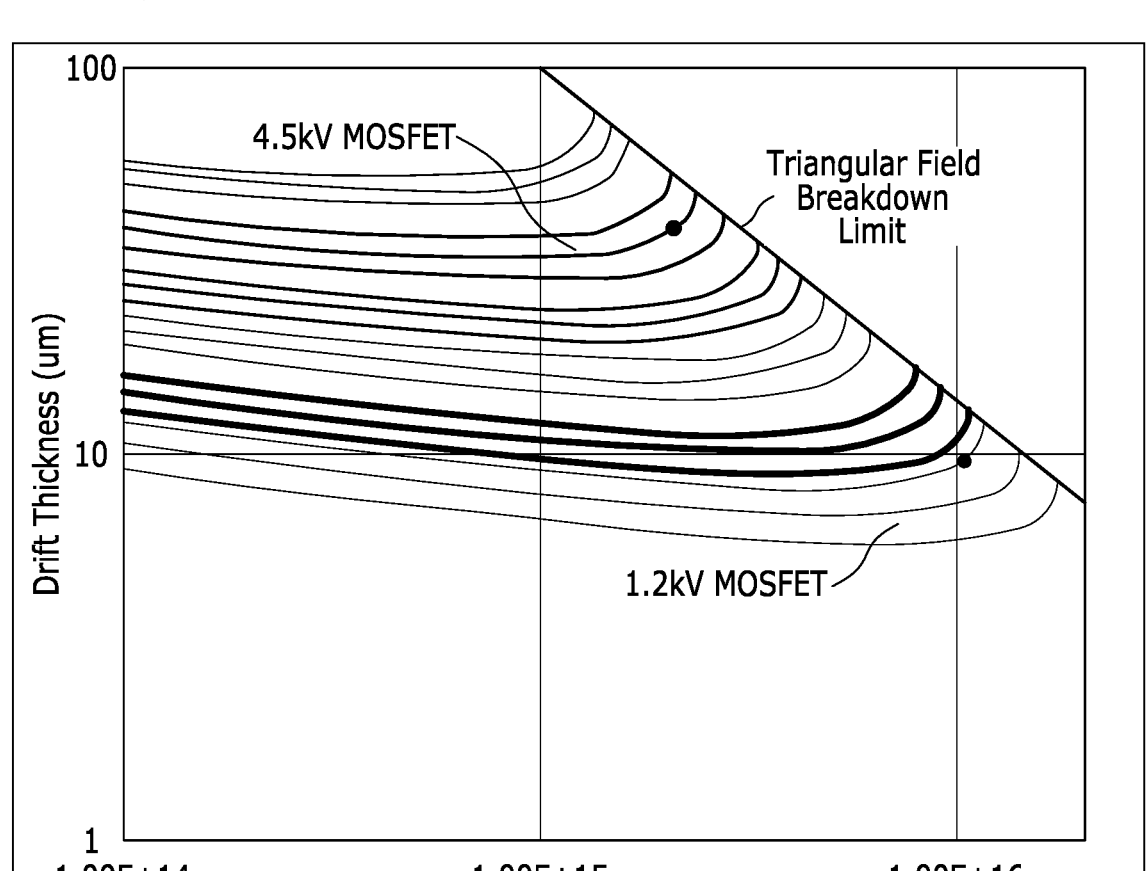
FIG. 2B comprises a graph of drift layer thickness as a function of drift doping of known semiconductor devices.

Referring to FIGS. 2A and 2B, graphs 26 and 28 illustrate an exemplary design curve for known semiconductor power devices. Specifically, graph 26 illustrates design curves for unipolar SiC device blocking regions showing blocking layer resistance as a function of blocking layer doping for certain specific design blocking voltages. Graph 28 illustrates design curves for unipolar SiC device blocking regions showing blocking layer thickness as a function of blocking layer doping for certain specific design blocking voltages. The triangular electrical field breakdown limit is illustrated by the diagonal line on both graph 26 and graph 28. The design curves on the left of the triangular breakdown voltage limit range illustrate known devices from device classes of 1.2 kV to 7.5 kV. The design curves illustrate devices which result in trapezoidal electric field profiles, i.e., devices which include drift layers that are completely depleted at the maximum voltage rating. Further, as shown in graphs 26 and 28, the design curves extend substantially vertically at the triangular field breakdown limit for each device class design curve. This means that no additional drift thickness can increase the breakdown voltage given a constant drift layer doping.

In use, the graphs 26 and 28 may be used for the design process of differently rated conventional semiconductor devices, such as the conventional semiconductor device 10, and in particular, the epitaxial or drift layer, such as epitaxial layer 14. Typically, the design process begins with selecting a target breakdown voltage for the application of the conventional semiconductor device 10 will be used. Once selected, a doping concentration for the target breakdown voltage is selected. The doping concentration is generally selected near the minimum of the design curve of graph 26 using the specific device class intended. The minimum of the design curves tends to be near triangular breakdown limit of the device class curve. The minimum of the design curve indicates the minimum drift layer resistance. Graphs 28 and 26 provide the required thickness and the resulting resistance respectively. As described above, the designs of these conventional devices have a doping concentration and thickness combination that is selected to be within a threshold of the triangular field breakdown limits for the intended device class. For devices designed at the triangular field breakdown limit, as applied voltage increases toward the limit, the drift layer depletes completely just as the device reaches breakdown. For devices below the triangular-field breakdown limit, the drift layer depletes before the device reaches breakdown. The resulting electric field profile is trapezoidal and extends partially into the substrate. Graphs 26 and 28 are provided as an illustration of the design process only, in practice, epitaxial doping/thickness specification may include tolerances, such that the specification will result in a rectangle on the thickness versus doping plot and a more complex outline on the resistance versus doping plot.

Figure 3A:
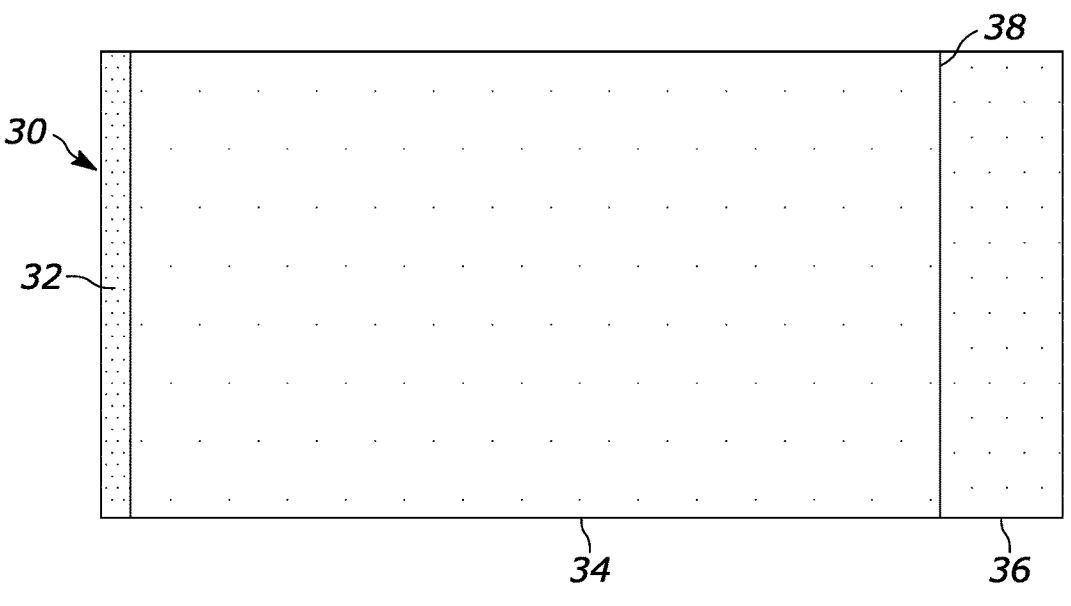
FIG. 3A illustrates a first prior art semiconductor device.
Figure 3B:
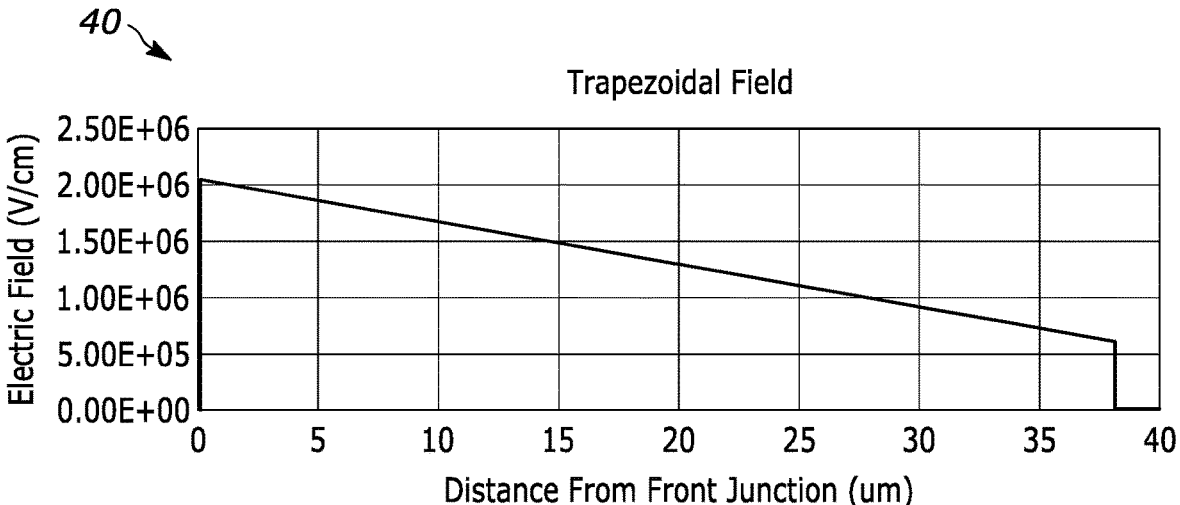
FIG. 3B comprises a graph of the first prior art semiconductor device operating at its breakdown voltage.
Figure 3C:
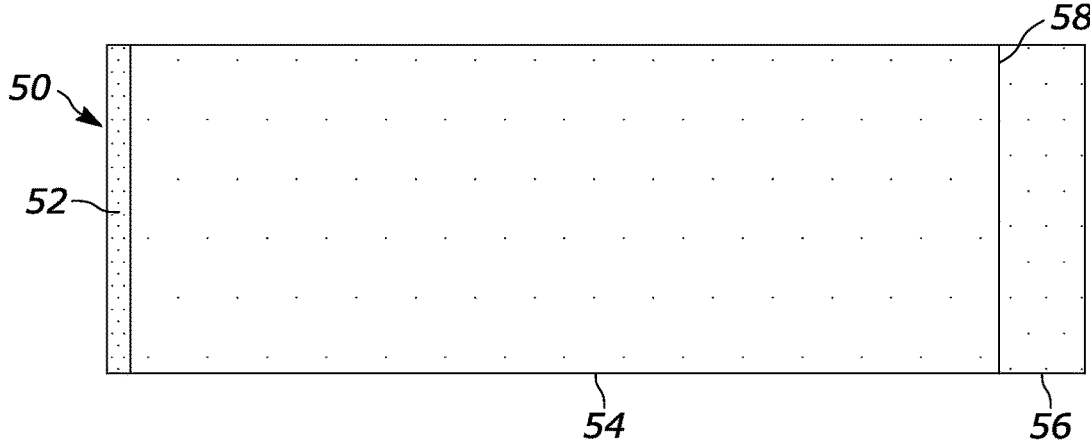
FIG. 3C illustrates a second prior art semiconductor device.
Figure 4:
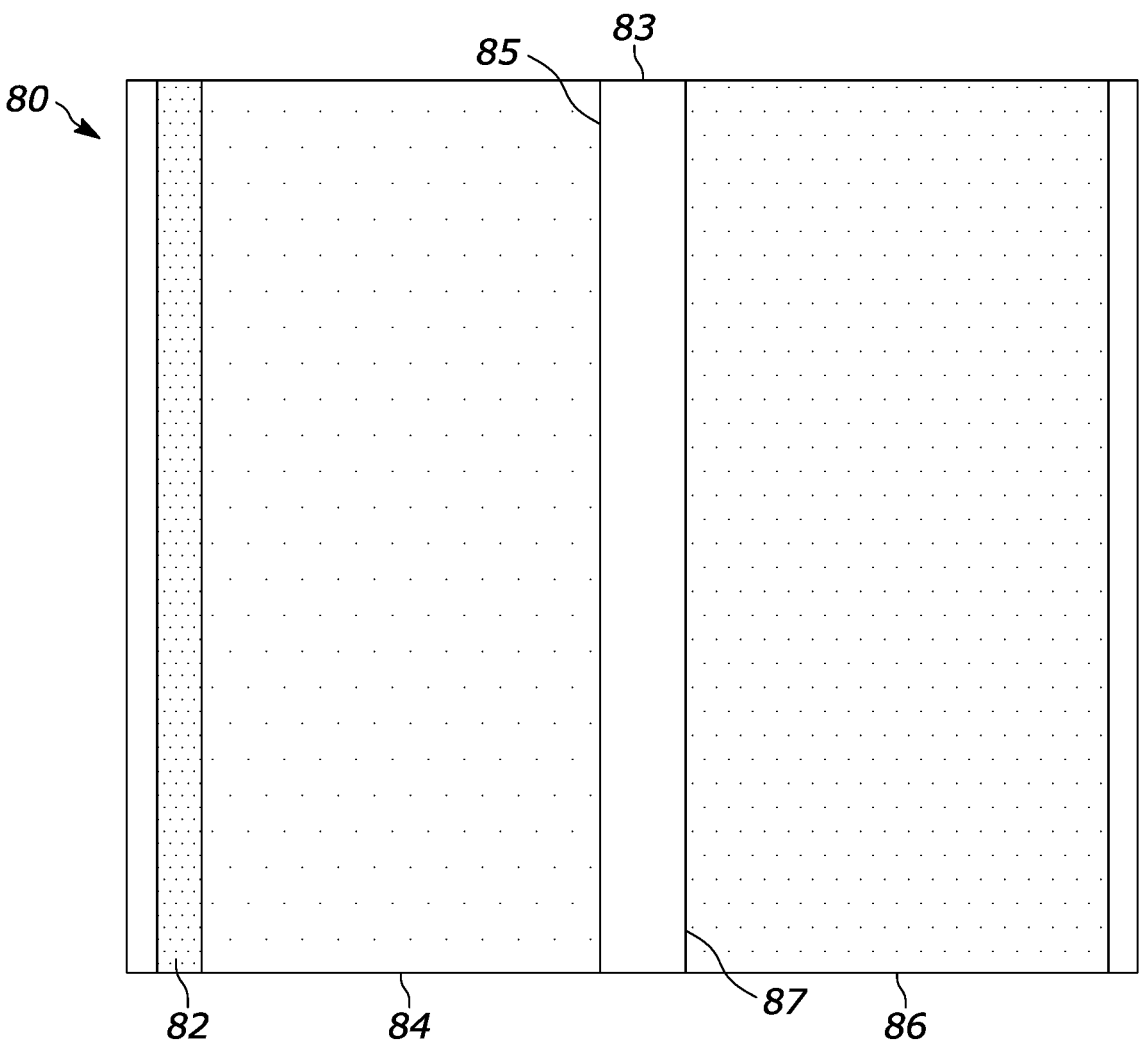
FIG. 4 illustrates a third prior art semiconductor device.

FIGS. 3A, 3C, and 4 illustrate several different approaches for providing radiation hardened semiconductor power devices. Conventional approaches of providing radiation hardening includes derating and the inclusion of a buffer layer. Derating a device involves taking a semiconductor device design with a higher voltage rating and setting a lower maximum operating voltage from what the device was initially designed to handle. A device that is derated to operate at a maximum operating voltage typically has a drift layer that is less doped and thicker as compared to an unhardened semiconductor device originally designed to operate at the same maximum operating voltage. As such, the derated device has a significantly higher on-state loss as compared to an unhardened semiconductor device designed to operate at the same maximum operating voltage. FIGS. 3A and 3C illustrate devices that may be used as a derated device.

As shown in FIG. 3A, a first prior art device 30 is shown including a p-type layer 32, a large lightly doped epitaxial layer 34, a heavily doped substrate 36, and a junction 38 where the large lightly doped epitaxial layer 34 and heavily doped substrate 36 meet. As used herein, a heavily doped substrate may include a doping concentration of between $1 \times 10^{18}$ cm$^{-3}$ and less than $4 \times 10^{19}$ cm$^{-3}$. For illustrative purposes only, the heavily doped substrate 36 is only partially shown. Graph 40 illustrates the depletion of the first prior art device 30 by how far the electrical field profile extends into the large lightly doped epitaxial layer 34 towards the junction 38 and the heavily doped substrate 36, as shown in FIG. 3B. Specifically, graph 40 illustrates a one-dimensional cross section graph of the first prior art device 30 operating at its breakdown voltage, with linear distance on the x-axis and magnitude of electric field on the y-axis. The first prior art device 30 is a 4.5 kV class device operated at 5 kV breakdown voltage. Similar to the conventional semiconductor device 10 and graph 22, the first prior art device 30 operating at the breakdown voltage has a trapezoidal electric field across the drift layer of the first prior art device 30.

Figure 3D:
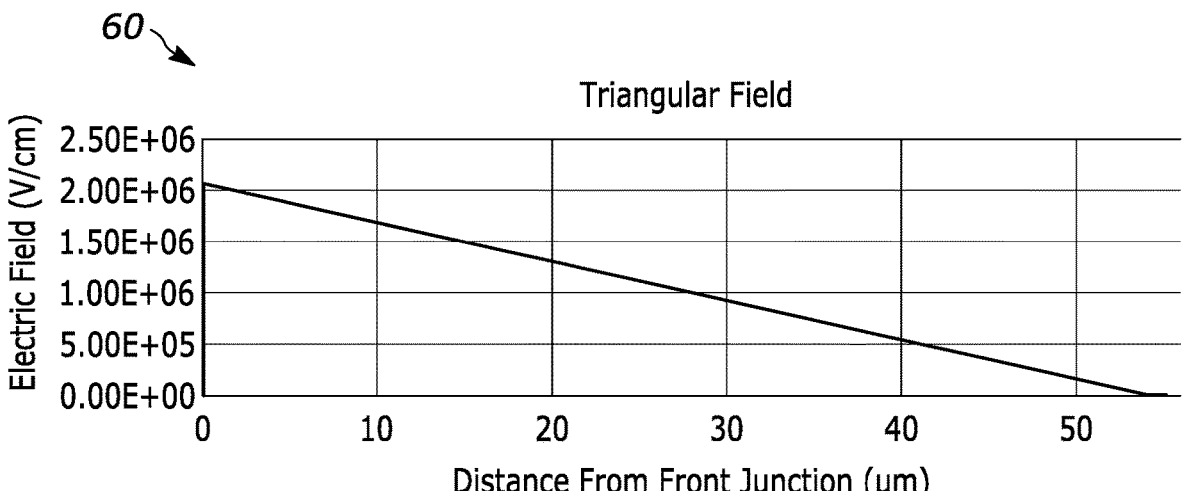
FIG. 3D comprises a graph of the second prior art semiconductor device operating at its breakdown voltage.

A second prior art solution using a device is provided in FIG. 3C, which shows a second prior art device 50 that includes a p-type layer 52, a large lightly doped epitaxial layer 54, a heavily doped substrate 56, and a junction 58 where the large lightly doped epitaxial layer 54 and heavily doped substrate 56 meet. For illustrative purposes only, the heavily doped substrate 56 is shown as being smaller than the large lightly doped epitaxial layer 54. Graph 60 illustrates the depletion of the second prior art device 50 by how far the electrical field profile extends into the large lightly doped epitaxial layer 54, as shown in FIG. 3D Specifically, graph 60 illustrates a one-dimensional cross section graph of the second prior art device 50 operating at its breakdown voltage, with linear distance on the x-axis and magnitude of electric field on the y-axis. The second prior art device 50 is a 4.5 kV class device with operated at 5.5 kV breakdown voltage. In contrast to the first prior art device 30, the second prior art device 50 may avoid complete depletion of the large lightly doped epitaxial layer 54 when operating at the maximum operating voltage. In this instance, the second prior art device 50 breakdowns before the large lightly doped epitaxial layer 54 is completely depleted and provides blocking at high voltages.

Due to the size of the large lightly doped epitaxial layer 54 of the second prior art device 50, the device breaks down approximately at complete depletion as compared to the size of the large lightly doped epitaxial layer 34 of the first prior art device 30. Because the second prior art device 50, and in particular, the large lightly doped epitaxial layer 54, breaks down at approximately complete depletion, and not after complete depletion, as shown in graph 40 of the first prior art device 30, the second prior art device 50 may be more useful for blocking high voltages. While the large lightly doped epitaxial layer 54 was not completely depleted, as shown in graph 60, the large lightly doped epitaxial layer 54 had nearly 100% depletion. Comparing the first prior art device 30 and the second prior art device 50, and in particular the large lightly doped epitaxial layer 34 and the large lightly doped epitaxial layer 54, an addition of approximately 40% additional thickness in the epitaxial layers, results in approximately a 10% increase in the breakdown voltage.

Figure 6A:
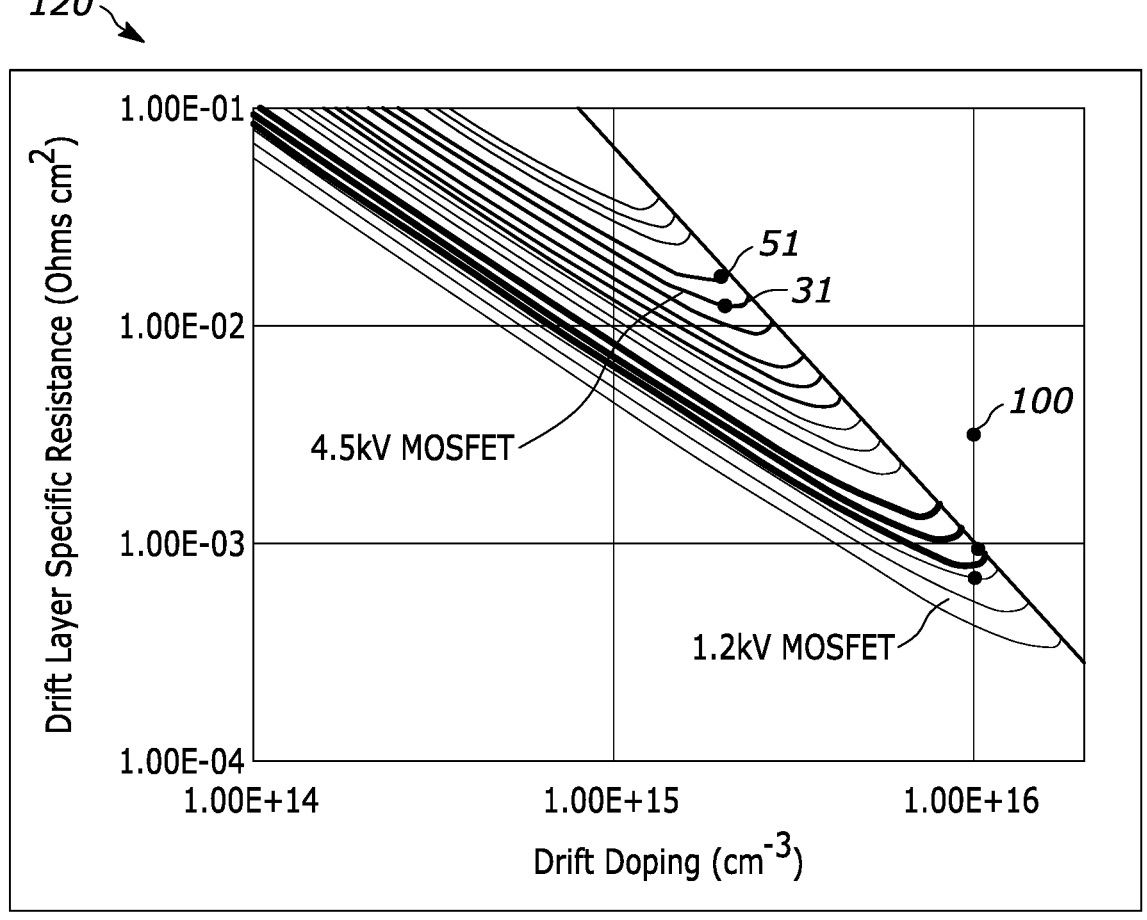
FIG. 6A depicts a graph of drift layer resistance as a function of drift doping of known semiconductor devices as compared to the radiation hardened semiconductor power device of FIG. 5A.
Figure 6B:
FIG. 6B depicts a graph of drift layer thickness as a function of drift doping of known semiconductor devices as compared to the radiation hardened semiconductor power device of FIG. 5A.
Figure 6B:
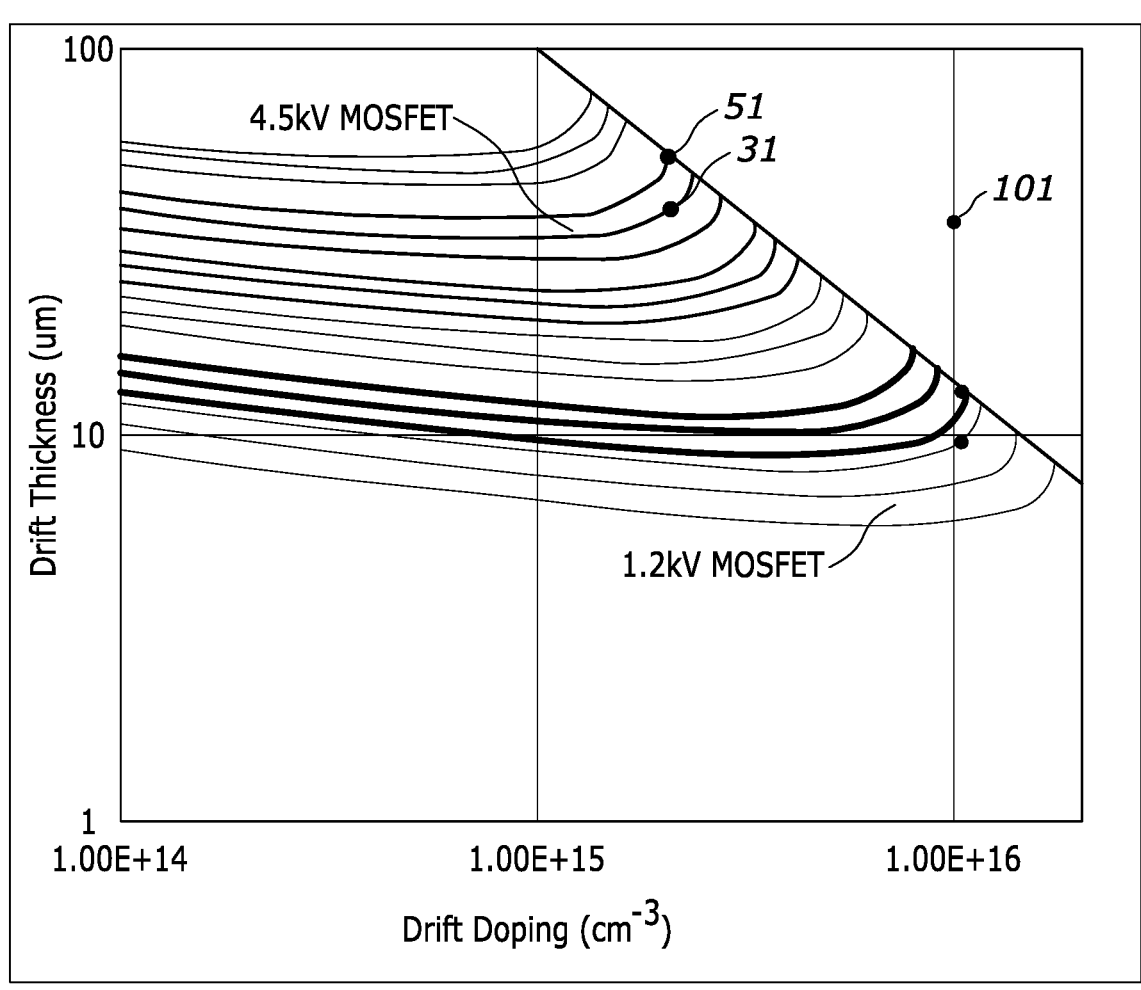

The devices shown in FIG. 3A and FIG. 3C could be operated as a derated device. As discussed above, a derated device is a device operating at a much lower voltage, such as operating the first prior art device 30 and the second prior art device 50 at 1.2 kV. In doing so, the device is more likely to survive a radiation event, resulting in a radiation hardened device. However, the on-state resistance losses of such device would be much higher than a device initially designed for 1.2 kV based on the design curves in graphs 26 and 28 due to the lower doping concentration. Specifically, as shown in FIG. 2A, and FIGS. 6A and 6B discussed below, the drift layer resistance of the first prior art device 30 and the second prior art device 50, is much higher than the conventional semiconductor device 10 which is a 1.2 kV class device. Further, the first prior art device 30 and the second prior art device 50, due to the light doping of the epitaxial layers, can also be more costly due to the need for a consistent and uniform epitaxial layer doping at the lower doping.

Referring to FIG. 4, a semiconductor device 80 with a buffer layer is shown. The semiconductor device 80 includes a p-type layer 82, a drift layer 84, a buffer layer 83, and a substrate 86. The semiconductor device 80 includes a drift to buffer junction 85 and the buffer to substrate junction 87.

During a radiation event, the buffer layer 83 disperses at least a portion of the resulting electric field created in the drift layer 84 through the buffer layer 83 before reaching the substrate 86. The dispersion may additionally spread the electric field across the buffer layer 83 and slow the depletion of the drift layer 84. In doing so, the semiconductor device 80 is able to survive the radiation event, such as the single event effects and/or single event burnout when a semiconductor device is struck by heavy ions, beta, gamma, or neutrons while operating near its maximum voltage rating. Similar to the first prior art device 30 and the second prior art device 50 operating as derated devices, while the semiconductor device 80 may be considered radiation hardened, the drift layer 84 may be completely and/or substantially depleted, in the range of 90% or more depletion. Additionally, due to the added buffer layer 83, the construction of the semiconductor device 80 is more complex than the conventional semiconductor device 10, the first prior art device 30, and the second prior art device 50. The complex construction is more time consuming and costly due to the need for a more complex epitaxial layer growth.

Generally speaking, the various aspects of the present disclosure provide a radiation hardened semiconductor device which balances the need to block high voltages while minimizing and/or reducing additional on-state resistance losses. This may be achieved through the use of a heavily doped and thick drift layer compared to the epitaxial layers of the devices discussed above. In doing so, the amount of depletion of the present disclosure is substantially less than the other devices described. While those skilled in the art may believe this is wasteful and/or adding additional resistance due to the doping or length of the thick drift layer, in doing so, the present disclosure device may block high voltage and survive a radiation event while maintaining a lower amount of on-state resistance losses. Additionally, the present disclosure device may be more cost effective to produce as the buffer layer 83 of the semiconductor device 80 creates a complex structure to manufacture, and the lightly doped nature of the large lightly doped epitaxial layer 34 and 54 of the respective first prior art device 30 and second prior art device 50 create a more costly epitaxial layer with higher resistances.

Figure 5A:
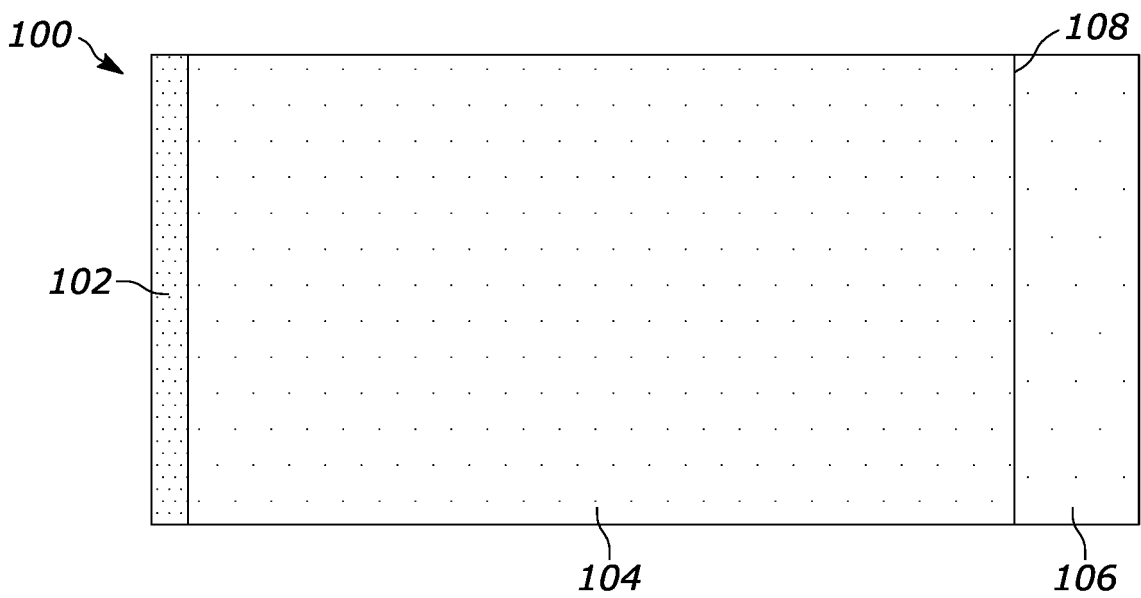
FIG. 5A illustrates a radiation hardened semiconductor power device according to one embodiment.

Referring to FIG. 5A, a radiation hardened semiconductor device 100 is shown. The radiation hardened semiconductor device 100 includes a p-type layer 102, a drift layer 104 (such as, for example, a large heavily doped epitaxial layer), a substrate 106, and a junction 108. The drift layer 104 is designed such that the radiation hardened semiconductor device 100 can block high voltages and survive a radiation event while maintaining relatively low on-state resistance losses as compared to a derated device. In some embodiments, the drift layer 104 includes a doping concentration between $1\times10^{15}$ cm$^{-3}$ and $1.5\times10^{16}$ cm$^{-3}$ and a thickness between 15 µm and 200 µm. In some embodiments, for uses where the maximum voltage rating is around 1200V, the drift layer 104 includes a thickness between 15 µm and 50 µm, and for uses where the maximum voltage rating is around 4500V, the drift layer 104 includes a thickness between 50 µm and 200 µm. As used herein, the drift layer 104 is heavily doped in comparison to the large lightly doped epitaxial layers 34 and 54 as described above. The drift layer 104 has a lesser doping as compared to the substrate 106.

Figure 5B:
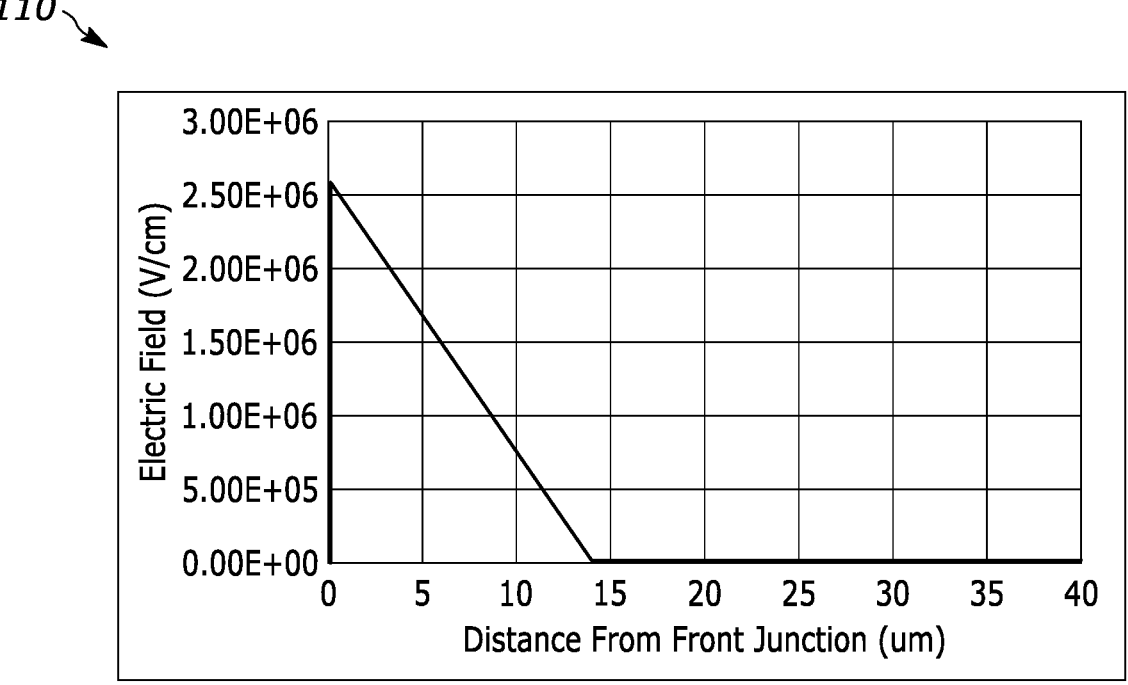
FIG. 5B depicts a graph of the radiation hardened semiconductor power device of FIG. 5A operating at its breakdown voltage.

The resulting electrical field from operating the radiation hardened semiconductor device 100 at the maximum voltage rating is shown in FIG. 5B. Specifically, FIG. 5B illustrates a one-dimensional cross section graph of the radiation hardened semiconductor device 100 operating at its breakdown voltage, with linear distance on the x-axis and magnitude of electric field on the y-axis. The radiation hardened semiconductor device 100 is a 1.2 kV class device. As illustrated by graph 110, the resulting electrical field profile is a substantially triangular electrical field. This is due to the radiation hardened semiconductor device 100 depleting at around 80% or less, or stated differently, the electric field penetrating only 80% of the drift layer 104. In this instance, the electrical field profile penetrates approximately 40% of the large drift layer 104. The depletion of the radiation hardened semiconductor device 100 is illustrated by how far the electrical field profile extends into the drift layer 104 towards the junction 108 and the substrate 106, as shown in the graph 110.

The additional thickness and doping of the drift layer 104 as compared to the devices described above yields a device that has 80% or less of the drift layer 104 depleted when breakdown occurs while operating at the maximum voltage rating. Because the drift layer 104, and in turn the radiation hardened semiconductor device 100, is not completely depleted, the radiation hardened semiconductor device 100 is able to survive a radiation event while minimizing and/or optimizing the on-state resistance losses.

In some embodiments, the drift layer 104 may be less than 60% depleted, such that the electric field extends less than 60% into the drift layer 104, when operating at a predetermined maximum operating voltage. In yet further embodiments, the drift layer 104 may be less than 50%-20% depleted. The radiation hardened semiconductor device 100 may be a unipolar radiation hardened semiconductor device. As an example, the radiation hardened semiconductor device 100 may be a silicon carbide diode or metal-oxide-semiconductor field-effect transistor (MOSFET). Further, the radiation hardened semiconductor device 100 may be a junction barrier Schottky (JBS) diode.

As compared to the conventional semiconductor device 10, the radiation hardened semiconductor device 100 maintains a similar doping level of the drift layer 104 as compared to the epitaxial layer 14 of unhardened device design for the same voltage rating. In contrast, the radiation hardened semiconductor device 100 provides for a substantially thicker drift layer 104 as compared to the epitaxial layer 14. The thickness of the drift layer 104 has been found to provide the advantages described herein as it relates to blocking high voltages, surviving a radiation event, avoiding complete depletion, and optimizing on-state resistance losses. By increasing the thickness of the drift layer 104 and maintaining a similar doping to the conventional semiconductor device 10, radiation hardening is achieved in the radiation hardened semiconductor device 100.

In some embodiments, by including highly doped and thick drift layer, the radiation hardened semiconductor device 100 is substantially less susceptible to single event effects and/or single event burnout. Single event burnout may occur when a semiconductor device is struck by heavy ions, beta, gamma, or neutrons while operating near its maximum voltage rating. This is a known failure point for the conventional semiconductor device 10.

Referring to FIGS. 6A and 6B, graphs 120 and 122 illustrate the exemplary design curves for known semiconductor power devices including the radiation hardened semiconductor device 100 of FIG. SA. Similar to graph 26, graph 120 illustrates drift layer resistance as a function of drift doping. Similar to graph 28, graph 122 illustrates drift layer thickness as a function of drift doping. The triangular electrical field breakdown limit is illustrated by the diagonal line on both graph 120 and graph 122. The drift layer resistance, drift doping, and drift layer thickness of the radiation hardened semiconductor device 100 are provided on both graph 120 and 122 as the point 101.

As shown in graph 120, the radiation hardened semiconductor device 100 includes a drift doping and drift layer resistance, the drift layer resistance is larger than the conventional 1.2 kV class design devices but smaller than the above described 4.5 kV class design devices, as shown by point 31 relating to the first prior art device 30 and point 51 relating to the second prior art device 50. Similarly, as shown in graph 122, the radiation hardened semiconductor device 100 includes a drift doping comparable to the conventional 1.2 kV class design devices and larger than the above described 4.5 kV class design devices. Finally, the radiation hardened semiconductor device 100 has a drift layer thickness larger than the conventional 1.2 kV class design devices but comparable to the above described 4.5 kV class design devices. As discussed above, because the radiation hardened semiconductor device 100 includes a more heavily doped and thicker drift layer, the device is able to survive radiation events, unlike the conventional semiconductor device. This is due to the drift layer not being completely depleted at breakdown voltage, with at least a 20% margin, as opposed to the conventional design curves illustrated in graphs 120 and 122. The design process of the radiation hardened semiconductor device 100 provides a device with a doping concentration and thickness combination that would be outside of designs that would result from the conventional design process.

Figure 7:
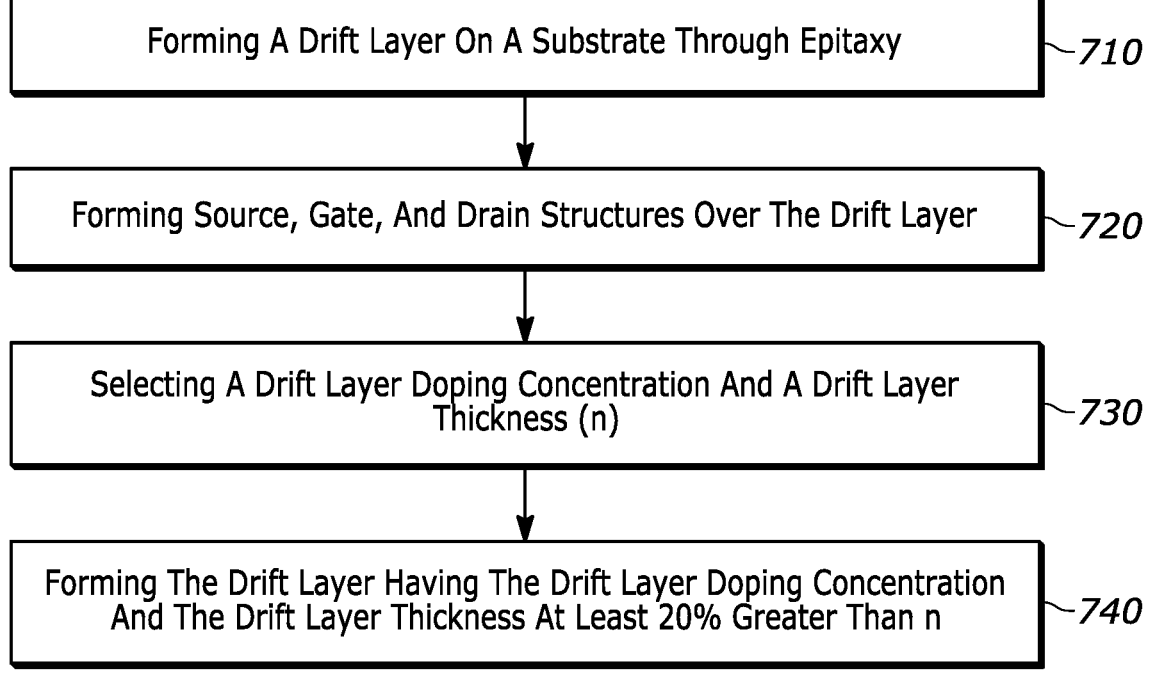
FIG. 7 depicts a method of forming a radiation hardened semiconductor power device according to one embodiment.

In designing and forming the radiation hardened semiconductor device 100, as shown in FIG. 7, the substrate 106 is provided. At step 710 an epitaxial growth chamber is used to grow and/or form the drift layer 104 on the substrate 106. At step 720 a source, gate, and drain structures are formed over the drift layer 104. At step 730, and as discussed above, a drift layer doping concentration and a drift layer thickness (n) are selected. Finally, at step 740, the drift layer 104 having the drift layer doping concentration and the drift layer thickness at least 20% greater than n is formed.

As discussed above, the present disclosure device may block high voltage and survive a radiation event while maintaining, and allowing for, a lower amount of on-state resistance losses. This results in the present device to be optimized and more cost effective to produce than the known devices described above. In this way, the present device is more cost effective while providing additional benefits as compared to the buffer layer 83 of the semiconductor device 80 which creates a complex structure to manufacture, and compared to the lightly doped nature of the large lightly doped epitaxial layer 34 and 54 of the respective first prior art device 30 and second prior art device 50 which create a more costly epitaxial layer with higher on-state resistance losses.

Further aspects of the disclosure are provided by the subject matter of the following clauses:

A semiconductor device including a heavily doped substrate; and a drift layer disposed on the heavily doped substrate, the drift layer having a doping concentration and a thickness; wherein the doping concentration and the thickness of the drift layer are such that when the semiconductor device is operating at a predetermined target operating voltage, an electrical field profile in the drift layer extends less than 80% of the thickness of the drift layer.

The semiconductor device of any preceding clause, wherein the electrical field profile is substantially triangular.

The semiconductor device of any preceding clause, wherein when the semiconductor device is operating at the predetermined target operating voltage, the electrical field profile in the drift layer extends less than 60% of the thickness of the drift layer.

The semiconductor device of any preceding clause, wherein when the semiconductor device is operating at the predetermined target operating voltage, the electrical field profile in the drift layer extends less than 50% of the thickness of the drift layer.

The semiconductor device of any preceding clause, wherein when the semiconductor device is operating at the predetermined target operating voltage, the electrical field profile in the drift layer extends less than 30% of the thickness of the drift layer.

The semiconductor device of any preceding clause, wherein when the semiconductor device is operating at the predetermined target operating voltage, the electrical field profile in the drift layer extends less than 20% of the thickness of the drift layer.

The semiconductor device of any preceding clause, wherein when the semiconductor device is operating at the predetermined target operating voltage the electrical field profile in the drift layer extends less than 45% of the thickness of the drift layer.

The semiconductor device of any preceding clause, wherein the semiconductor device is a unipolar radiation hardened semiconductor device.

The semiconductor device of any preceding clause, wherein the semiconductor device is a silicon carbide diode or metal-oxide-semiconductor field-effect transistor (MOSFET).

The semiconductor device of any preceding clause, wherein the predetermined target operating voltage is 1.2 kV.

The semiconductor device of any preceding clause, wherein the electrical field profile in the drift layer extends 17 µm into the drift layer at the predetermined target operating voltage.

The semiconductor device of any preceding clause, wherein when the semiconductor device is operating at the predetermined target operating voltage, the doping concentration of the drift layer is between $6 \times 10^\wedge 15$ cm$^{-3}$ and $1.5 \times 10^\wedge 16$ cm$^{-3}$ and the thickness of the drift layer is between 15 µm and 50 µm.

The semiconductor device of any preceding clause, wherein the predetermined target operating voltage is 4.5 kV.

The semiconductor device of any preceding clause, wherein the electrical field profile in the drift layer extends 54 µm into the drift layer at the predetermined target operating voltage.

The semiconductor device of any preceding clause, wherein when the semiconductor device is operating at the predetermined target operating voltage of 4500V, the doping concentration of the drift layer is between $1 \times 10^\wedge 15$ cm$^{-3}$ and $2 \times 10^\wedge 15$ cm$^{-3}$ and the thickness of the drift layer is between 50 µm and 200 µm.

A method of forming the semiconductor of any preceding clause including forming the drift layer on the substrate through epitaxy; and forming source, gate, and drain structures over the drift layer.

A method of forming the semiconductor of any preceding clause including selecting a drift layer doping concentration and a drift layer thickness (n) based on reducing an on-state resistivity of a drift layer at a predetermined operating voltage; forming the drift layer having the drift layer doping concentration and the drift layer thickness at least 20% greater than n.

A semiconductor device including a heavily doped substrate; and a drift layer on the heavily doped substrate, the drift layer having a doping concentration and a thickness; wherein the doping concentration is selected based on reducing a drift layer resistivity of the drift layer operating at a predetermined target operating voltage, wherein an electric field profile in the drift layer extends n µm into the drift layer at the predetermined target operating voltage, and wherein the thickness of the drift layer is at least 20% greater than n µm.

The semiconductor device of any preceding clause, wherein when the semiconductor device is operating at the predetermined target operating voltage, the thickness of the drift layer is at least 40% greater than n µm.

The semiconductor device of any preceding clause, wherein when the semiconductor device is operating at the predetermined target operating voltage, the thickness of the drift layer is at least 50% greater than n µm.

This written description uses examples to disclose the present disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A semiconductor device comprising:
   a heavily doped substrate; and
   a drift layer disposed on the heavily doped substrate, the drift layer having a doping concentration and a thickness, wherein the doping concentration is substantially the same for all of the thickness of the drift layer;
   wherein the doping concentration and the thickness of the drift layer are such that, when the semiconductor device is operating at a maximum voltage rating, an electrical field profile in the drift layer extends less than 80% of the thickness of the drift layer, wherein the electrical field profile is substantially triangular.

2. The semiconductor device of claim 1, wherein when the semiconductor device is operating at the maximum voltage rating, the electrical field profile in the drift layer extends less than 60% of the thickness of the drift layer.

3. The semiconductor device of claim 1, wherein when the semiconductor device is operating at the maximum voltage rating, the electrical field profile in the drift layer extends less than 50% of the thickness of the drift layer.

4. The semiconductor device of claim 1, wherein when the semiconductor device is operating at the maximum voltage rating, the electrical field profile in the drift layer extends less than 30% of the thickness of the drift layer.

5. The semiconductor device of claim 1, wherein when the semiconductor device is operating at the maximum voltage rating, the electrical field profile in the drift layer extends less than 20% of the thickness of the drift layer.

6. The semiconductor device of claim 1, wherein when the semiconductor device is operating at the maximum voltage rating, the electrical field profile in the drift layer extends less than 45% of the thickness of the drift layer.

7. The semiconductor device of claim 1, wherein the semiconductor device is a unipolar radiation hardened semiconductor device.

8. The semiconductor device of claim 1, wherein the semiconductor device is a silicon carbide diode or metal-oxide-semiconductor field-effect transistor (MOSFET).

9. The semiconductor device of claim 1, wherein the maximum voltage rating is 1.2 kV.

10. The semiconductor device of claim 9, wherein the electrical field profile in the drift layer extends 17 µm into the drift layer at the maximum voltage rating.

11. The semiconductor device of claim 9, wherein when the semiconductor device is operating at the maximum voltage rating, the doping concentration of the drift layer is between $6 \times 10^{15}$ cm$^{-3}$ and $1.5 \times 10^{16}$ cm$^{-3}$ and the thickness of the drift layer is between 15 µm and 50 µm.

12. The semiconductor device of claim 1, wherein the maximum voltage rating is 4.5 kV.

13. The semiconductor device of claim 12, wherein the electrical field profile in the drift layer extends 54 µm into the drift layer at the maximum voltage rating.

14. The semiconductor device of claim 12, wherein when the semiconductor device is operating at the maximum voltage rating of 4500V, the doping concentration of the drift layer is between $1 \times 10^{15}$ cm$^{-3}$ and $2 \times 10^{15}$ cm$^{-3}$ and the thickness of the drift layer is between 50 µm and 200 µm.

15. A method of forming a semiconductor device of claim 1, comprising:

selecting a drift layer doping concentration and a drift layer thickness (n) based on reducing an on-state resistivity of a drift layer for the semiconductor device operating at a predetermined operating voltage, the semiconductor device including:

a heavily doped substrate; and the drift layer disposed on the heavily doped substrate, the drift layer having the drift layer doping concentration and the drift layer thickness;

wherein the doping concentration and the thickness of the drift layer are such that, when the semiconductor device is operating at the predetermined operating voltage, an electrical field profile in the drift layer extends less than 80% of the thickness of the drift layer; and forming the drift layer having the drift layer doping concentration and the drift layer thickness at least 20% greater than n.

16. The method of claim 15, further comprising operating at the predetermined operating voltage, wherein the thickness of the drift layer is at least 40% greater than n µm when the semiconductor device is operating at the predetermined operating voltage.

17. The method of claim 15, further comprising operating at the predetermined operating voltage, wherein the thickness of the drift layer is at least 50% greater than n µm when the semiconductor device is operating at the predetermined operating voltage.

\* \* \* \* \*